United States Patent [19]

Terajima

[11] Patent Number: 5,256,929
[45] Date of Patent: Oct. 26, 1993

[54] VIBRATOR SUPPORT STRUCTURE

[75] Inventor: Kokichi Terajima, Tokyo, Japan

[73] Assignee: AKAI Electric Co., Ltd., Tokyo, Japan

[21] Appl. No.: 951,666

[22] Filed: Sep. 25, 1992

[30] Foreign Application Priority Data

Oct. 8, 1991 [JP] Japan .................. 3-260225

[51] Int. Cl.$^5$ ........................... H01L 41/08
[52] U.S. Cl. ...................... 310/326; 310/351; 310/352; 310/345
[58] Field of Search ............ 310/326, 327, 345, 346, 310/348, 351, 352

[56] References Cited

U.S. PATENT DOCUMENTS 3,754,153  8/1978  Carpenter et al. ............. 310/352 X
4,328,442  5/1982  Tanaka et al. ................. 310/326

FOREIGN PATENT DOCUMENTS 313006  1/1991  Japan .

Primary Examiner—Mark O. Budd
Attorney, Agent, or Firm—Meltzer Lippe Goldstein, Wolf, Schlissel & Sazer

[57] ABSTRACT

A vibrator support structure for a vibrator having a vibrating body comprises a support stand, a first damper material disposed on top of the support stand, and a first substrate disposed on top of the first damper material. In addition, the vibrator support structure includes a second damper material disposed on top of only a portion of the first substrate and a second substrate disposed on top of the second damper material. Two support filaments are also provided for supporting the vibrating body, one of which is mounted on the exposed portion of the first substrate, while the other of which is mounted on the second substrate.

6 Claims, 2 Drawing Sheets

VIBRATOR SUPPORT STRUCTURE

FIELD OF THE INVENTION

This invention relates to a support structure for a vibrator suitable for use in vibration gyros which support structure permits constantly stabilized flexural vibration in the vibrator.

BACKGROUND OF THE INVENTION

FIG. 1 shows an example of a prior art vibrator support structure. In FIG. 1, a vibrator 9 is made by adhering piezoelectric elements 8a and 8b to two side surfaces 1a and 1b, respectively, that are adjacent but separated by a ridgeline of vibrator body 1 which vibrator body I has the overall shape of a rectangular column. Two support filaments 3 and 4, which are nearly rectangular U-shaped when seen from the front, are attached to ridgeline 2 which is opposite the aforesaid ridgeline separating the piezoelectric elements 8a and 8b. The feet of these support filaments 3 and 4 are attached on substrates 5c and 5d, respectively, which substrates 5c and 5d are positioned so as to be mutually separated on damper material 6 disposed on a support stand 7.

One end of each lead line 10a and 10b is connected to the piezoelectric elements 8a and 8b, respectively, while the other end of each lead line 10a, 10b is connected to terminals 11a and 11b, respectively. These terminals 11a and 11b, as well as ground terminal 11c connected to support filament 4, are connected to an electric circuit (not shown) via the respective lead wires 12a, 12b and 12c. When a drive a.c. voltage is applied from an electric circuit (not shown) via these lead wires 12a, 12b, 12c, 10a and 10b, and terminals 11a and 11b, to the piezoelectric elements 8a and 8b, vibrator 9 undergoes flexural vibration along the directions of the X-axis depicted in the drawing.

In a support structure of this sort, the main purpose of arranging damper material 6 over support stand 7 is to shield out external vibrations in order to prevent external leakage of the vibration of vibrator 9 and to remove the effects imparted to vibrator 9 by external vibration. The reason why substrates 5c and 5d are mutually separated on a single damper material 6 is to remove any restraint on the flexural vibration of vibrator 9 by freeing the back and forth displacement of the mountings of the support filaments 3 and 4 relative to vibrator 9.

However, this sort of vibrator support structure has problems in that the support posture of vibrator 9 may become rather unstable because substrates 5c and 5d are mutually separated on damper material 6. That is, when lead wires 12a, 12b and 12c are bent over during the packaging of the vibrator 9 arranged on support stand 7 together with the electric circuit connected to lead wires 12a, 12b and 12c inside a specified case, stresses such as tension and contraction occur in lead wires 12a, 12b and 12c. The subsequent transmittal of these stresses to substrate 5d causes deformations in damper material 6 that directly supports this substrate 5d, which damper material 6 comprises a soft material such as rubber or sponge. As a result, if the substrate 5d subsides somewhat after the stresses are removed, its left end side slants at an angle $\Theta_1$, as shown for example by the side view in FIG. 2(a). The leg 4b of one support filament 4 attached to this substrate 5d compensates its posture of support for vibrator 9 by swaying somewhat toward the other support filament 3 from the vertical posture (as shown by the virtual line in the drawing) so that the stability of flexural vibration in vibrator 9 is lost. Also, when substrate 5d subsides at its left end side as shown in frontal view in FIG. 2(b), the single support filament 4 attached to substrate 5 distorts its posture relative to the vibrator axis thereby substantially decreasing the stability of flexural vibration.

This invention resulted from investigations undertaken to resolve the problems of such support structures. The object of this invention is to provide a vibrator support structure that does not impart an effect on the vibrator support posture arising from bending lead wires and, consequently, is capable of maintaining the constant stability of the flexural vibration of the vibrator.

SUMMARY OF THE INVENTION

This and other objects are achieved by the present invention which provides a vibrator support structure for a vibrator having a vibrating body, the support structure comprising a support stand, a first damper material disposed on top of the support stand, and a first substrate disposed on top of the first damper material. In addition, the vibrator support structure includes a second damper material disposed on top of only a portion of the first substrate and a second substrate disposed on top of the second damper material. Two support filaments are also provided for supporting the vibrating body, one of which is mounted on the exposed portion of the first substrate, while the other of which is mounted on the second substrate.

If any subsidence of this first substrate occurs resulting in displacements such as rising, the second substrate displaces in a corresponding manner as the first substrate. Consequently, the support filament on the first substrate and the support filament on the second substrate displace together to the same degree and in the same direction. As a result, the relative postures of both support filaments relative to the vibrator are maintained constantly fixed, and the vibrator is capable of constantly stable flexural vibration regardless of any displacement of the first substrate.

BRIEF DESCRIPTION OF THE DRAWINGS

Preferred embodiments of this invention will be explained below based on the drawings wherein like numerals refer to like elements, and wherein.

DETAILED DESCRIPTION OF THE INVENTION

Figure 1:
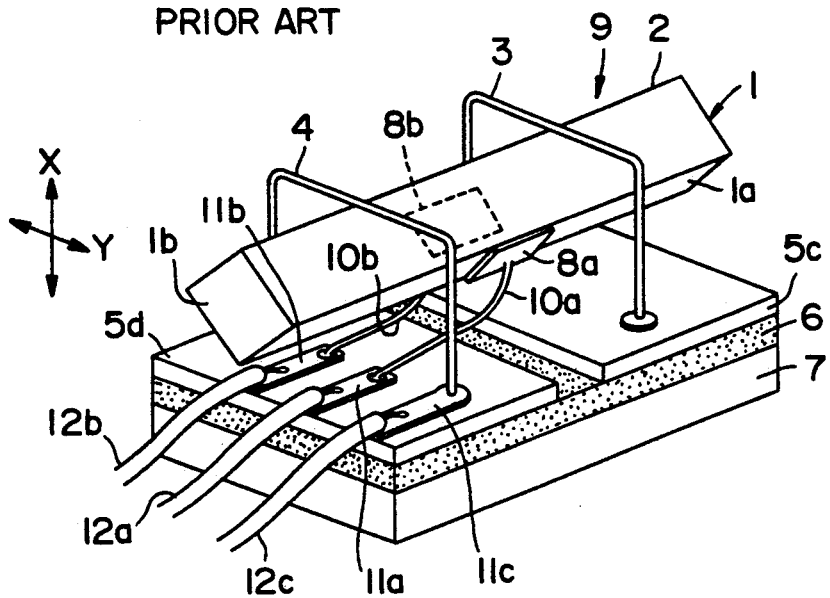
FIG. 1 is a perspective view showing a prior art vibrator support structure.
Figure 2A:
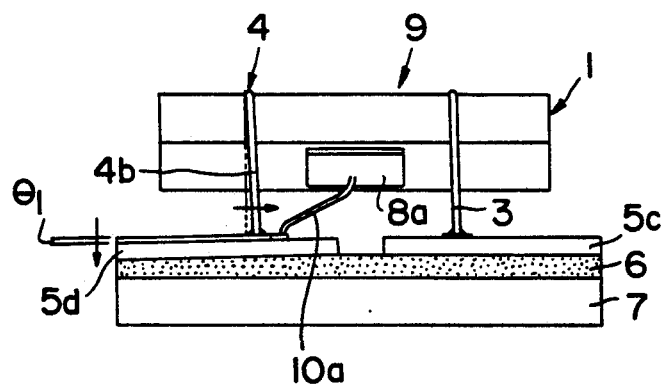
FIGS. 2(a)-(b) show the effect of subsidence on the prior art vibrator support structure of FIG. 1.
Figure 2B:
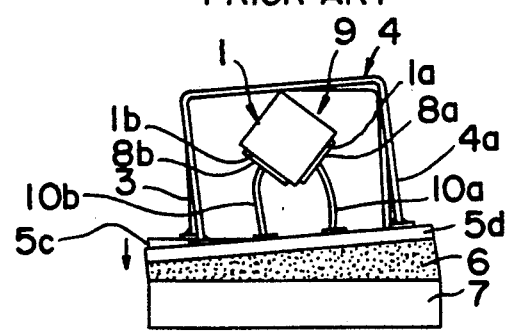
Figure 3:
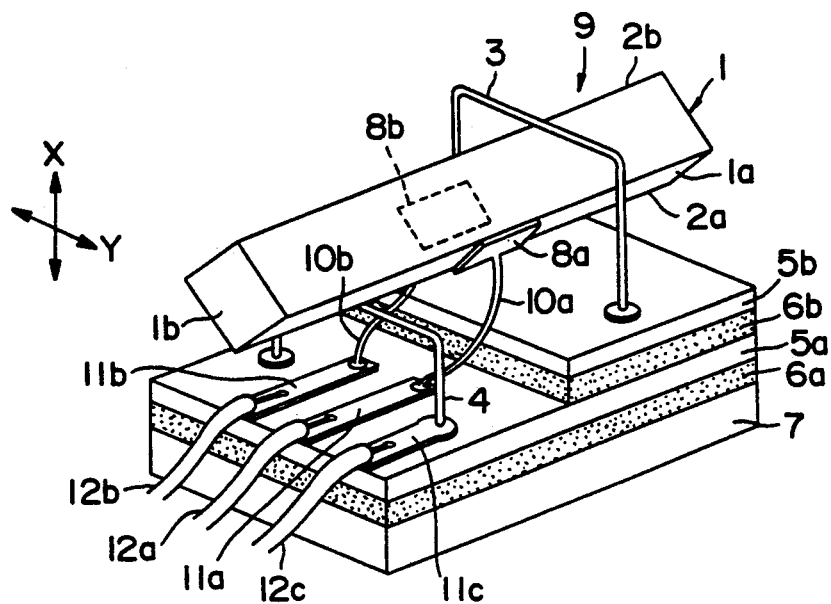
FIG. 3 is a perspective view showing an embodiment of the invention.

FIG. 3 is a perspective view showing an embodiment of this invention. In FIG. 3, 1 indicates a vibrator body shaped overall as a rectangular column, 1a and 1b indicate side surfaces which are separated by a ridgeline 2a, 8a and 8b indicate piezoelectric elements adhered to the side surfaces 1a and 1b, respectively, and 9 indicates a vibrator constructed by attaching the piezoelectric elements 8a and 8b to the two side surfaces 1a and 1b, respectively, of vibrator body 1. In this vibrator 9, a first support filament 3 that has a frontal shape that is nearly a rectangular U-shape is attached, with its legs downward, to the ridgeline 2b positioned diagonally opposite from the ridgeline 2a that separates the side surfaces 1a and 1b. The support filament 3 is attached at or near a position corresponding to one nodal point of the vibrator 9. A second support filament 4 also has a frontal shape that is nearly a rectangular U-shape, with its legs downward, and is attached in the same manner as the support filament 3, to ridgeline 2a at or near a position corresponding to another nodal point of vibrator 9. In this embodiment, the support filament 4 has a shorter leg length than support filament 3.

In order that vibrator 9 be supported by support filaments 3 and 4 attached thereto, damper material 6a and first substrate 5a are successively arranged so that they cover support stand 7 over its entire surface. The feet of support filament 4 are attached to this first substrate 5a. The other damper material 6b and second substrate 5b are then successively arranged so that they cover only a portion of the first substrate. The feet of the support filament 3 are attached to this second substrate 5b.

The ends of lead wires 10a and 10b, which lead wires 10a and 10b are connected to piezoelectric elements 8a and 8b, respectively, are connected to the ends of terminals 11a and 11b, respectively, which terminals 11a and 11b are disposed on top of the first substrate 5a. The other ends of these terminals 11a and 11b, as well as the other end of ground terminal 11c connected to support filament 4, are connected to lead wires 12a, 12b and 12c, respectively. The lead wires 12a, 12b and 12c are in turn connected to an electric circuit that is not illustrated.

The aforementioned interconnections introduce flexural vibration into the vibrator 9 along the directions of the X axis depicted in the drawing when a drive a.c. voltage is supplied through lead wires 10a and 10b to the respective piezoelectric elements 8a and 8b. By rotating vibrator 9 around its longitudinal axis while maintaining its flexural vibration, this vibrator 9 also experiences flexural vibration along the directions of the Y-axis depicted in the drawing as a result of the Coriolis force. Consequently, by separately extracting only the output voltages of the piezoelectric elements 8a and 8b, the Coriolis force and thus, the rotational angular velocity of vibrator 9, can be detected.

With such a construction, even if stresses are transmitted to first substrate 5a, such as by a bending deformation of the respective lead wires 12a, 12b and 12c which occurs while packaging vibrator 9 together with its electric circuit in a case, any displacement of first substrate 5a relative to support stand 7 will also be experienced by the second substrate 5b disposed on the damper material 6b located on the first substrate 5a. As a result, there is no relative positional change between first substrate 5a and second substrate 5b, so that vibrator 9 is supported in its initial support posture by means of the support filaments 3 and 4 even if first substrate 5a displaces.

Figure 4A:
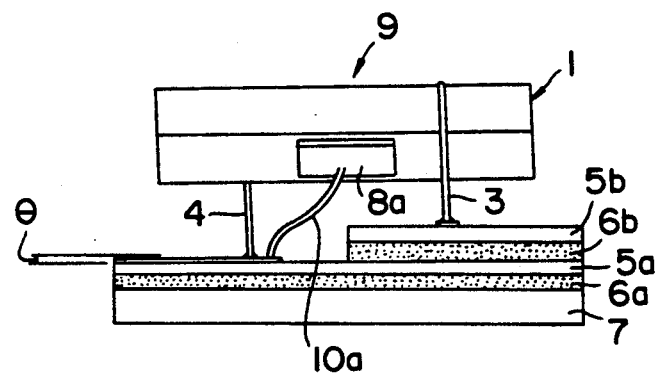
FIGS. 4(a)-(b) show the effect of subsidence on the vibrator depicted in FIG. 3.
Figure 4B:
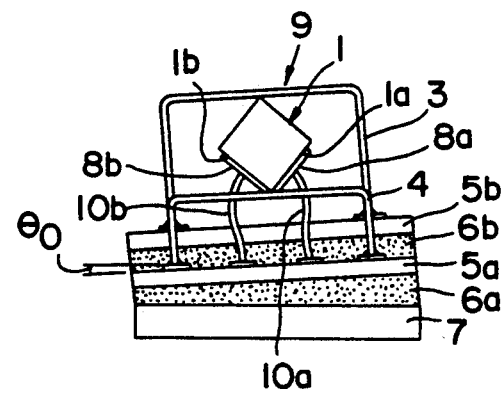

This is now explained with reference to the embodiment shown in FIGS. 4(a)–(b). When first substrate 5a subsides to angle Θ on the side where support filament 4 is attached, for example as illustrated in FIG. 4(a), second substrate 5b arranged on the first substrate 5a also subsides to angle Θ in the same direction so that there is no relative displacement between the two substrates. Consequently, vibrator 9 is supported constantly in a fixed relative posture by the respective support filaments 3 and 4 regardless of any subsidence in first substrate 5a. This also holds if one side end of first substrate 5a has subsided to angle Θ as is shown in FIG. 4(b), since, in this case, the second substrate 5b and interposed damper material 6b arranged on the first substrate 5a have the same subsidence displacement in the same direction as first substrate 5a. Hence, the support filaments 3 and 4 support vibrator 9 in the same initial posture with no relative displacement between them.

Thus, by following this support structure, the postures of support filaments 3 and 4 are maintained constantly stable relative to vibrator 9, so that the flexural vibration of vibrator 9 can be satisfactorily stabilized. Further, since first substrate 5a and second substrate 5b are separate elements, the fastenings of the sport filaments 3 and 4 to vibrator 9 have free relative displacement towards and away from one another during flexural vibration of vibrator 9. Thus, damping and other effects of these support filaments 3 and 4 on flexural vibration of the vibrator 9 can be sufficiently eliminated.

The above explanation of the invention was based on the illustrated embodiment, but the flexural vibration of vibrator 9 can be much more stabilized if the total thickness of damper material 6b and second substrate 5b is selected so that the leg length of support filament 3 to ridgeline 2a together with the thickness of damper material 6b and second substrate 5b is equal to the leg length of support filament 4. Additionally, each of the support filaments 3 and 4 is shown as single piece bodies in the drawings, but they can also have a construction in which each filament 3 or 4 is split at the fastening to vibrator 9 or elsewhere.

As is apparent from what was said above, this invention enables stabilized vibration in a vibrator by maintaining its vibrations posture constantly fixed without hindering the flexural vibration of the vibrator.

Finally, the aforementioned embodiments were intended to be merely illustrative. Numerous other embodiments may be devised by those having ordinary skill in the art without departing from the scope of the following claims.

I claim:

1. A vibrator support structure for a vibrator having a vibrating body, comprising:
    a support stand,
    a first damper material disposed on top of said support stand,
    a first substrate disposed on top of said first damper material,
    a second damper material, disposed on top of, but only partially covering, said first substrate,
    a second substrate disposed on top of said second damper material,
    a first support filament connected to said vibrating body and mounted on an exposed portion of said first substrate, and
    a second support filament connected to said vibrating body and mounted on said second substrate.

2. The vibrator support structure of claim 1 wherein said first and second support filaments have legs, the thickness of said second damper material and said second substrate compensating for any shortness in leg length of said second support filament relative to the leg length of said first support filament.

3. The vibrator support structure of claim 1 wherein said vibrating body has a polygonal lateral cross-section and wherein said first support filament is connected to said vibrating body along a first ridgeline and said second support filament is connected to said vibrating body along an oppositely located ridgeline.

4. The vibrator support structure of claim 1 wherein said first support filament is connected to said vibrating body in a region of a first nodal point of said vibrator, and said second support filament is connected to said vibrating body in a region of a second nodal point of said vibrator.

5. The vibrator support structure of claim 1 wherein said support filaments are inverted rectangular U-shaped.

6. The vibrator support structure of claim 1 wherein said first and second damper materials are resilient materials.

* * * * *